(12) United States Patent  
Liu et al.

(10) Patent No.: US 11,340,524 B2
(45) Date of Patent: May 24, 2022

(54) PHOTOMASK, METHOD OF FABRICATING A PHOTOMASK, AND METHOD OF FABRICATING A SEMICONDUCTOR STRUCTURE USING A PHOTOMASK

(71) Applicant: TAIWAN SEMICONDUCTOR MANUFACTURING COMPANY LTD., Hsinchu (TW)

(72) Inventors: Tzu Han Liu, Tainan (TW); Chih-Wei Wen, Tainan (TW); Chung-Hung Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 77 days.

(21) Appl. No.: 16/794,912

(22) Filed: Feb. 19, 2020

(65) Prior Publication Data
US 2020/0310243 A1 Oct. 1, 2020

Related U.S. Application Data

(60) Provisional application No. 62/827,488, filed on Apr. 1, 2019.

(51) Int. Cl.
C09J 7/30 (2018.01)
C09J 201/08 (2006.01)
B32B 27/40 (2006.01)
G03F 1/24 (2012.01)
G03F 1/48 (2012.01)
(Continued)

(52) U.S. Cl.
CPC .............. *G03F 1/48* (2013.01); *B32B 27/304* (2013.01); *B32B 27/40* (2013.01); *C09J 7/30* (2018.01); *C09J 201/08* (2013.01); *G03F 1/24* (2013.01); *G03F 1/60* (2013.01)

(58) Field of Classification Search
CPC ..... G03F 1/48; G03F 1/60; G03F 1/24; B32B 27/40; B32B 27/304; C09J 201/08; C09J 7/30

See application file for complete search history.

(56) References Cited

U.S. PATENT DOCUMENTS 5,397,665 A * 3/1995 Tabuchi .................... G03F 1/62
428/421
5,560,959 A * 10/1996 Shimoda ................. B05D 1/265
156/105

(Continued)

FOREIGN PATENT DOCUMENTS

CN 108728007 * 11/2018
JP 57-178241 * 11/1982

(Continued)

OTHER PUBLICATIONS

Machine translation of CN 108728007 ( Nov. 2018 ).*

(Continued)

*Primary Examiner* — Martin J Angebranndt
(74) *Attorney, Agent, or Firm* — WPAT, P.C., Intellectual Property Attorneys; Anthony King

(57) ABSTRACT

The present disclosure provides a photomask, including a front side having a patterned layer, a back side opposite to the front side, a sidewall connecting the front side and the back side, a reflective layer between the front side and the back side, and a polymer layer on the backside of the photomask.

20 Claims, 12 Drawing Sheets

(51) Int. Cl.
  *G03F 1/60*   (2012.01)
  *B32B 27/30*  (2006.01)

(56) References Cited

U.S. PATENT DOCUMENTS

| | | | |
|---|---|---|---|
| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 4/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 2011/0287348 | A1* | 11/2011 | Yoon .................. G03F 1/52 430/5 |
| 2013/0236818 | A1* | 9/2013 | Lee .................... G03F 1/24 430/5 |
| 2013/0323928 | A1* | 12/2013 | Tanaka ................ G03F 1/24 438/694 |
| 2020/0225571 | A1* | 7/2020 | Schedel ............... G03F 1/48 |

FOREIGN PATENT DOCUMENTS

| | | | |
|---|---|---|---|
| JP | 63-081354 | * | 4/1988 |
| JP | 2010-168474 | * | 8/2010 |
| JP | 2012-124196 | * | 6/2012 |
| JP | 2012-182235 | * | 9/2012 |
| JP | 2014-197628 | * | 10/2014 |
| WO | 94/12583 | * | 6/1994 |
| WO | 2017188728 | * | 11/2017 |
| WO | 2019191438 | * | 10/2019 |

OTHER PUBLICATIONS

Machine translation of JP 2010-168474 (2010).*
Abstract of CN 108300353 ( Jul. 2018 ).*
Machine translation of JP 2012-182235 (2012).*

* cited by examiner

PHOTOMASK, METHOD OF FABRICATING A PHOTOMASK, AND METHOD OF FABRICATING A SEMICONDUCTOR STRUCTURE USING A PHOTOMASK

CROSS REFERENCE TO RELATED APPLICATIONS

This application claims the benefit of prior-filed provisional application No. 62/827,488, filed Apr. 1, 2019, which is incorporated by reference in its entirety.

BACKGROUND

In the semiconductor industry, there is a trend toward higher device density. In order to achieve such higher density, smaller features are required. Such requirements likely involve scaling down device geometries to achieve lower fabrication costs, higher device integration density, higher speeds, and better performance. Along with the advantages from geometry size reductions, improvements to semiconductor devices are being made.

As semiconductor industry continues to evolve, advanced photolithography techniques have been widely used in integrated circuit fabrication operation. Photolithography operations may include techniques pertinent to coating a photoresist layer on a wafer and exposing the wafer to an exposing source.

Masks can be used in semiconductor fabrication operations to transfer a predetermined pattern onto a substrate. For example, after forming a layer over a substrate, the layer can be exposed to an actinic radiation through a mask, thus a pattern can be formed by subsequent development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
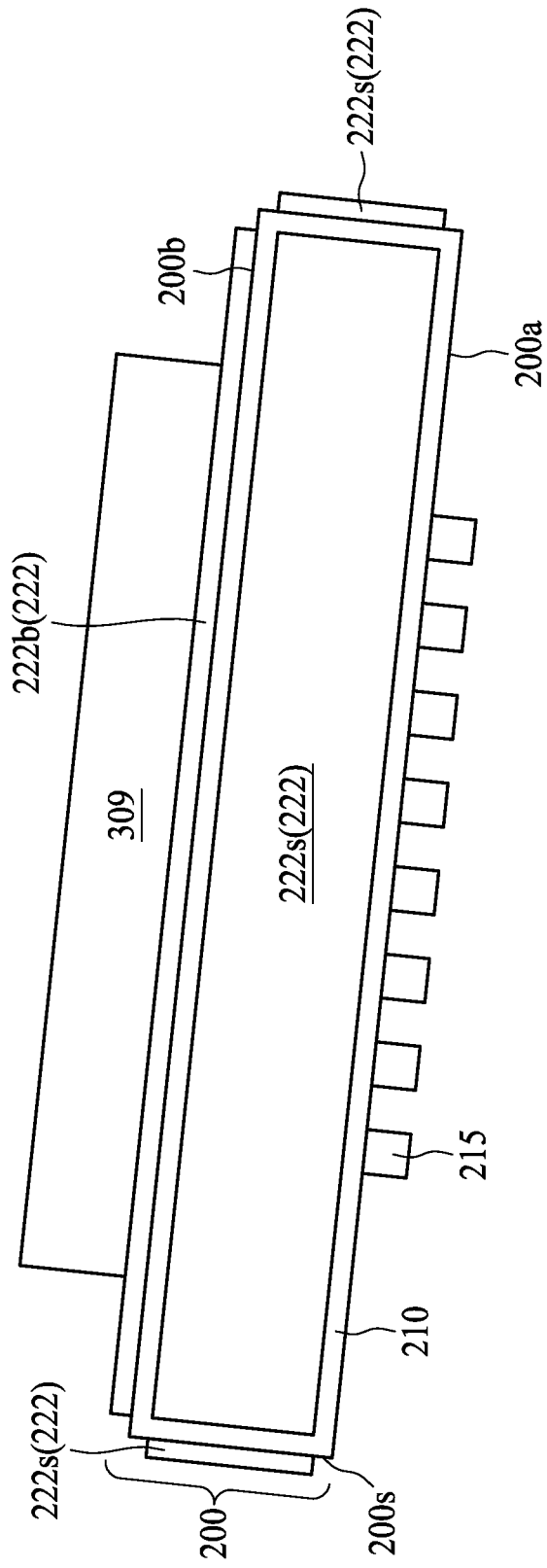
FIG. 1 is a front perspective view of a photomask and a chuck, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

During a photolithography operation, such as an extreme ultra-violet (EUV) photolithography operation, photomask may be carried by an electrostatic chuck with an adjustable angle facing radiation in order to complete the reflective mode of the photolithography operation. However, particles or scratches at a backside of the photomask (i.e., the side of the photomask contacting the electrostatic chuck) may weaken the control accuracy of adjustable angle of the photomask, and/or may weaken the carrying force between the photomask and the electrostatic chuck, which may cause the photomask detaching from the electrostatic chuck. Furthermore, particles may be attached to a surface of the photomask, and such particles may deteriorate the performance of lithography operations.

Conventionally, particles on a photomask may be removed by cleaning with wet chemical or by wiping. However, such procedures are time- and labor-consuming, and additional particles may fall on the photomask subsequent to cleaning/wiping operations. Another conventional operation is by placing a photomask in a sealing pod to prevent particles contamination. However, during the operations between taking out the photomask from the sealing pod and before lithography operations, particles may inevitably attached to the photomask causing contamination. Furthermore, the cleaning/wiping operations and sealing pod operations may not remedy scratches created on the photomask.

One lithography technique is extreme ultraviolet lithography (EUVL). The EUVL employs scanners using light in the extreme ultraviolet (EUV) region, having a wavelength of about 1-100 nm. EUV scanners use reflective rather than refractive optics, i.e., mirrors instead of lenses. The EUV lithography system includes a photomask stage configured to secure a photomask. In some embodiments, the photomask stage includes an electrostatic chuck (e-chuck) to secure the photomask. This is because that gas molecules absorb EUV light and the lithography system for the EUV lithography patterning is maintained in a vacuum environment to avoid the EUV intensity loss. By using reflective optics in the EUV system, the e-chuck holding the photomask is often controlled to tilt in a predetermined angle with respect to the underlying substrate to be exposed. Particles attached to the EUV photomask not only reduce the electrostatic force between the photomask and the e-chuck but also alter the preset tilting angle, rendering unsatisfactory exposure result. Therefore, particles on the EUV photomask are a sensitive factor affecting the performance of the EUV lithography system.

The present disclosure provides a photomask and a method of fabricating a photomask. The present disclosure also provides a method of forming an integrated circuit by using a photomask.

Figure 2:
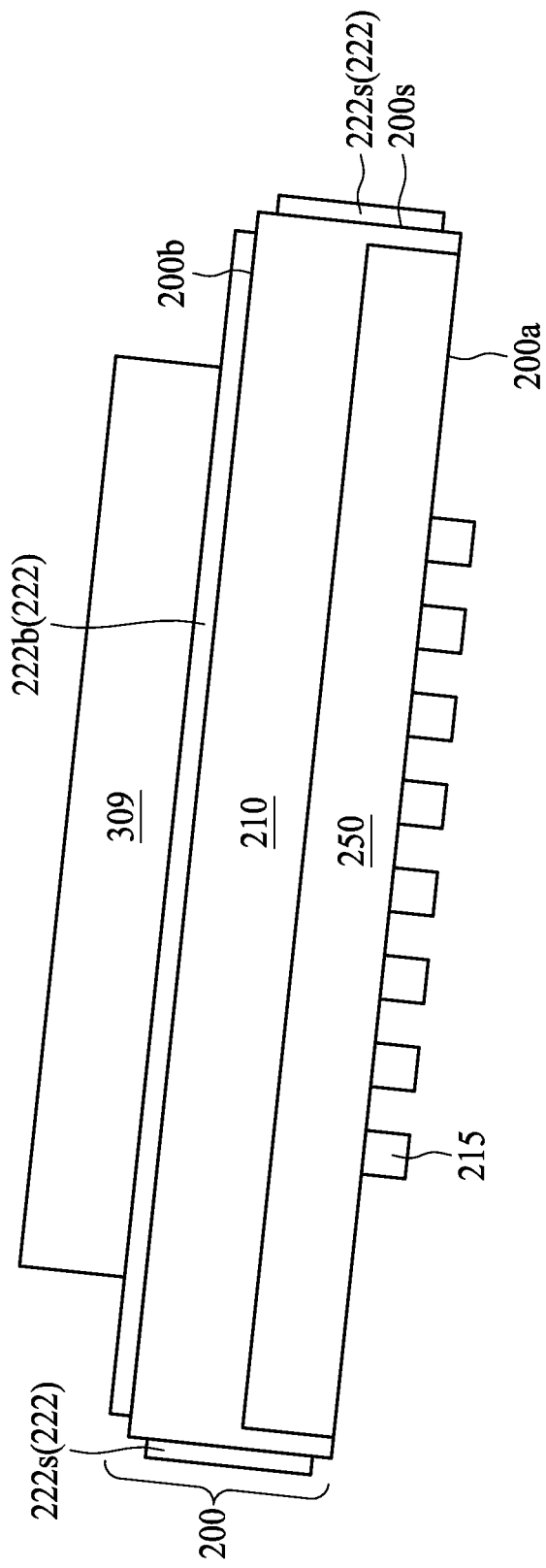
FIG. 2 is a cross sectional view of a photomask and a chuck, according to some embodiments of the present disclosure.

Referring to FIG. 1 and FIG. 2, FIG. 1 is a front perspective view of a photomask and a chuck, FIG. 2 is a cross sectional view of a photomask and a chuck, according to some embodiments of the present disclosure. A photomask 200 at least includes a patterned layer 215, a substrate 210, and a protection layer 222. The photomask 200 may further include a reflective layer 250. In some embodiments, the photomask 200 is a reflective photomask, such as an extreme ultraviolet (EUV) photomask, or the like.

The photomask 200 has a front side 200a and a backside 200b opposite to the front side 200a, wherein the front side 200a of the photomask 200 has the patterned layer 215. The photomask 200 further has a sidewall 200s connecting the front side 200a and the back side 200b. In some of the embodiments, the substrate 210 of the photomask 200 has a rectangular shape, and the photomask 200 has four sidewalls 200s, but the present disclosure is not limited thereto. The substrate 210 of the photomask 200 may include a low thermal expansion material (LTEM) or a silicon-based material, such as quartz. The reflective layer 250 is over the substrate 210 and between the front side 200a and the back side 200b of the photomask 200. The reflective layer 250 includes reflective material to reflect a radiation irradiated on the front side 200a of the photomask 200. In some embodiments, the reflective layer 250 includes metal. In some embodiments, the reflective layer 250 includes multi-material layer, such as multi-metal layer, alternating molybdenum and silicon (Mo—Si) layers, or the like. For example, a reflective layer 250 of an EUV photomask may include about 40 pairs to about 50 pairs of molybdenum and silicon, and the reflective layer 250 may have an EUV light reflectivity of up to 67% at 13.5 nm wavelength.

In some embodiments, the photomask 200 can further be secured by a chuck 309 during a photolithography operation. The chuck 309 can be an electrostatic chuck (E-chuck) which utilizes electrostatic force to secure the photomask 200, for example, coulomb force type chuck, Johnson-Rahbeck force type chuck (which can be referred to as J-R chuck), gradient force type chuck, positively charged chuck, negatively charged chuck, or the like. In some of the embodiments, the photomask 200 may be secured by the chuck 309 in a tilted manner, wherein the tilt angle may be adjustable by the chuck 309.

Specifically, when some particles falls on the back side 200b of the photomask 200, or when scratches is created on the back side 200b of the photomask 200, an electrostatic force between the photomask 200 and the chuck 309 may be weaken due to reduced contact area between the photomask 200 and the chuck 309. In addition, a tilt angle of the photomask 200 may be affected by particles or scratches on the back side 200b of the photomask 200. Furthermore, the particles on a surface of the photomask 200 may cause contamination, and scratches may hinder the removal of particles.

Figure 3:
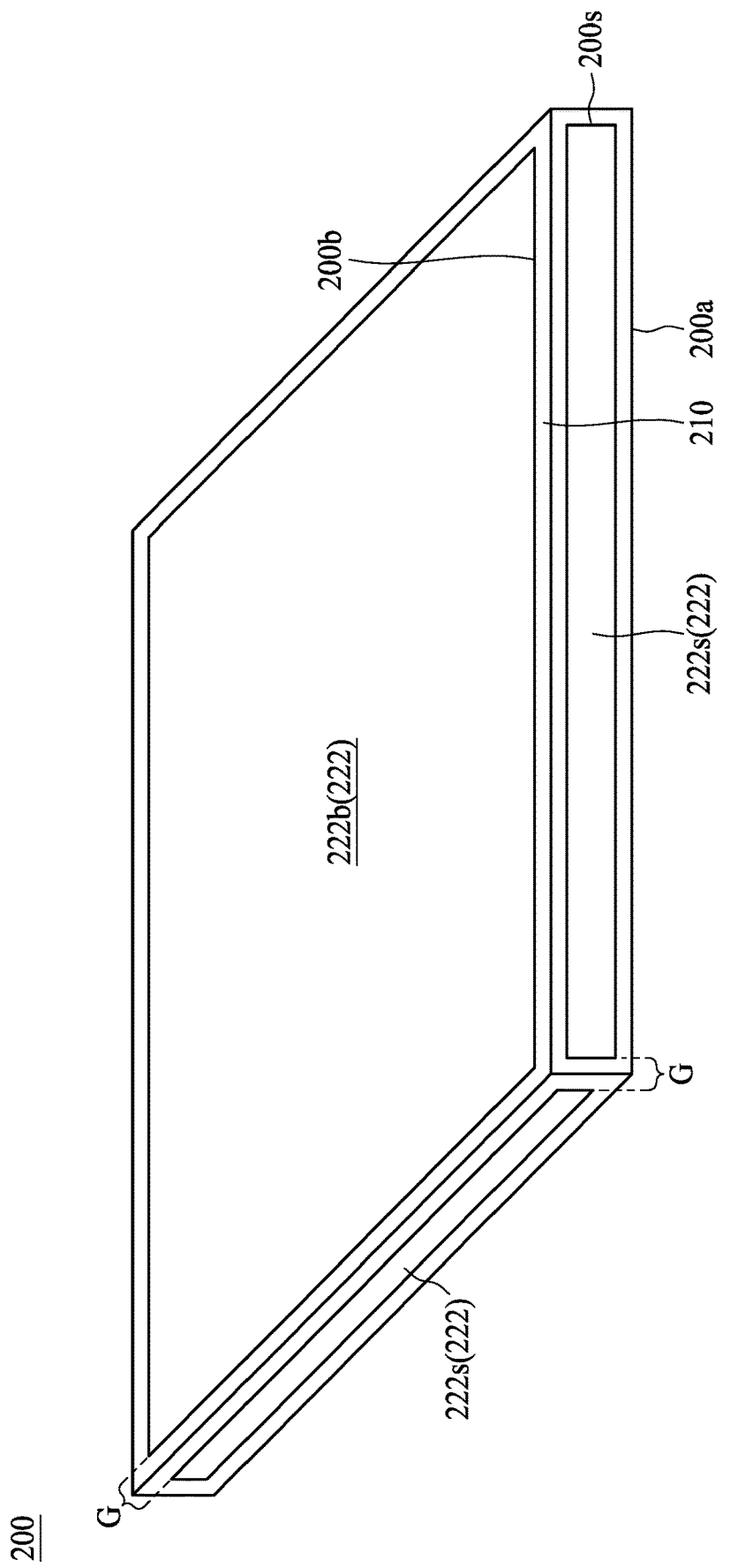
FIG. 3 is a perspective view of a photomask, according to some embodiments of the present disclosure.

In order to facilitate the removal of particles and/or improve the recovery of the scratches, one or more protection layer 222 is disposed on a side of the photomask 200. Referring to FIG. 1, FIG. 2 and FIG. 3, FIG. 3 is a perspective view of a photomask, according to some embodiments of the present disclosure. At least one protection layer 222 is disposed on a side of the photomask 200. Specifically, a protection layer 222 is disposed on the back side 200b of the photomask 200 (which can also be referred to as a substrate side) and/or disposed on the sidewall 200s of the photomask 200. For example, as shown in FIG. 3, a protection layer 222b is disposed on the back side 200b and a plurality of protection layers 222s are respectively disposed on each of the sidewall 200s. In the case of the photomask 200 having four sidewalls 200s connecting between the front side 200a and the back side 200b, four protection layers 222s are respectively on four sidewalls 200s of the photomask 200. However, the present disclosure is not limited thereto, wherein the side of the photomask 200 at least partially covered by a protection layer 222 is optional. The material of the protection layer 222b on the back side 200b of the photomask 200 and the protection layer 222s on the sidewall 200s of the photomask 200 may, or may not be identical. The material of the protection layer 222 (which may include the protection layer 222b and/or the protection layer 222s) will be subsequently discussed in FIG. 4 and FIG. 5. Note that hereinafter the protection layer 222b and the protection layer 222s may be collectively deemed as the protection layer 222.

Since the particles on the protection layer 222 may travel from a back side 200b to a sidewall 200s of the photomask 200 as a result of the electric field generated by the e-chuck, the configuration of a gap G (i.e. the discontinuity of the protection layer 222) may hinder the particles from traveling across different sides of the photomask 200 by prohibiting the particles from crossing the gap G, thereby reducing the risk of particles falling on the patterned layer 215 or contaminating substrates or wafers during lithography operations. Thus, in some embodiments, if the protection layer 222 is disposed on more than one side of the photomask 200, each of adjacent protection layers 222 on adjacent sides are discontinuous and physically separated. In some embodiments, the gap G is at least 1 mm in order to effectively prohibiting the particles from crossing the gap G. If the gap G is less than a certain distance (such as 1 mm), the gap G may not effectively hinder the particles from traveling across different sides of the photomask 200. Alternatively stated, a portion of the back side 200b and/or a portion of the sidewall 200s is exposed from the protection layer 222. For example, a gap G is between the protection layer 222b on the back side 200b and a protection layer 222s on the sidewall 200s. For another example, a gap G is between a protection layer 222s on the sidewall 200s and another protection layer 222s on the sidewall 200s.

Furthermore, since the protection layer 222 may be expanded under an elevated temperature when performing a lithography operation, the gap G may provide an adequate space for expansion in order to prevent one protection layer 222 to contact an adjacent protection layer 222. A width of the gap G is wide enough so as to prevent merging of the adjacent protection layers 222 under the elevated temperature. For example, the photomask 200 may be elevated to in a range from about 50 to about 60 degree Celsius during an EUV lithography operation, and the gap G between two protection layer 222 may not close up when the photomask 200 is below 80 degree Celsius. In some embodiments, in the case of a length of a side of the photomask 200 being around 15.2 cm, a length of a side of the protection layer 222 may be around 15 cm.

Figure 4:
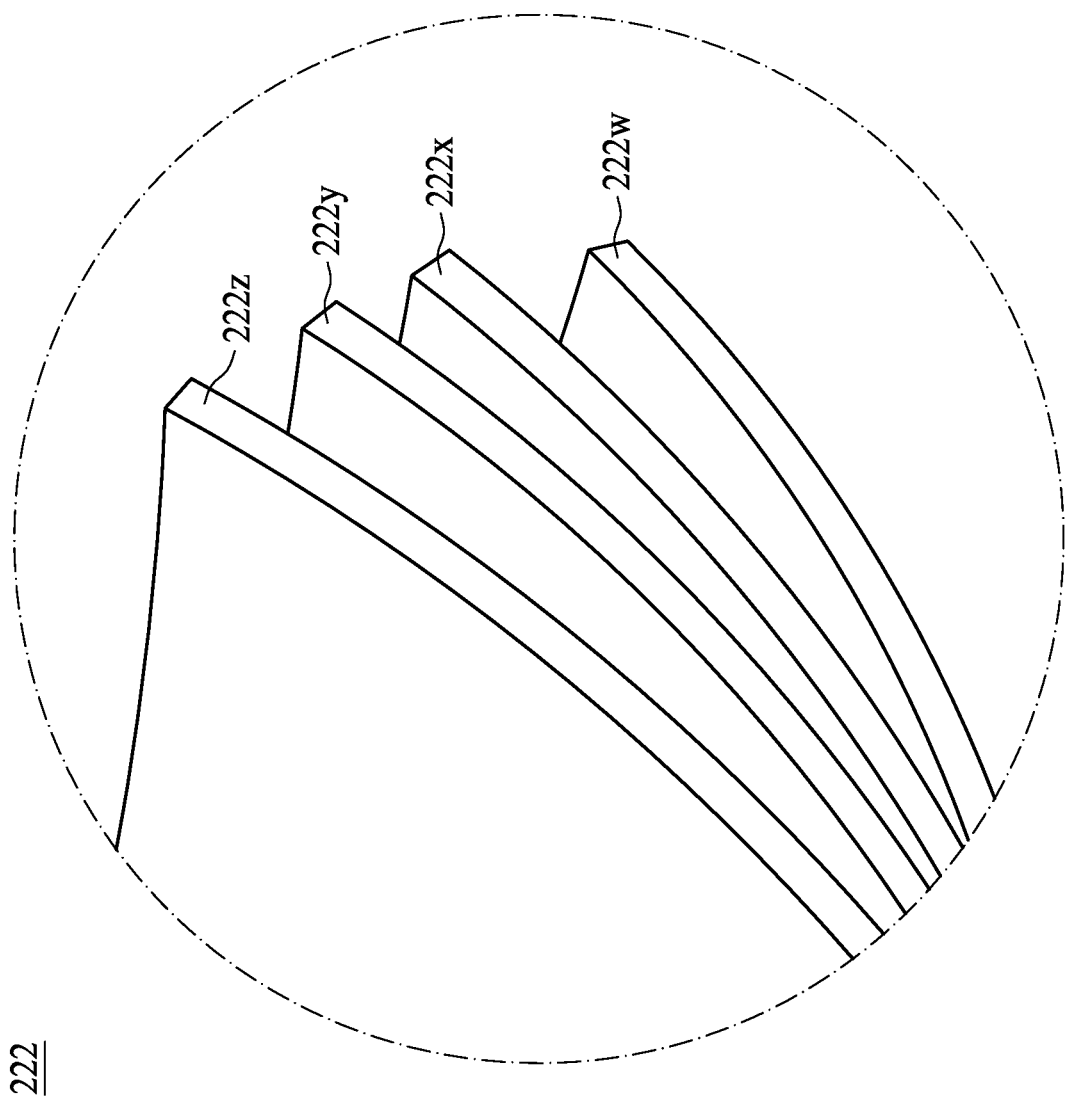
FIG. 4 is a schematic drawing showing a layered structure of a protection layer, according to some embodiments of the present disclosure.

Referring to FIG. 4, FIG. 4 is a schematic drawing showing a layered structure of a protection layer, according to some embodiments of the present disclosure. The protection layer 222 may include polymer. In some embodiments, the protection layer 222 may have a multi-layer structure. In some embodiments, the protection layer 222 may include an adhesive layer 222w (which may be the side attached to a surface of the photomask 200), a thermoplastic layer 222y over the adhesive layer 222w, and a hydrophobic layer 222z over the thermoplastic layer 222y. In some embodiments, the protection layer 222 may optionally further include a body layer 222x between the adhesive layer 222w and the thermoplastic layer 222y.

In some embodiments, the adhesive layer 222w may include polymer with proper cohesive strength, such as acrylic, styrene ethylene styrene (SEBS), polyethylene (PE), pressure-sensitive materials, the derivative thereof, the combination thereof, or the like. It should be noted that the adhesive layer 222w provide a sufficient cohesive strength so that the protection layer 222 does not unintentionally detached from the photomask 200 at least during a lithography operation. The adhesive layer 222w may further be intentionally detached from the photomask 200 with a proper removal operation, either by manual removal or by robotic removal, such as pulling the protection layer 222 from an edge. Furthermore, the aforesaid material of the adhesive layer 222w may leave less glue residue on the photomask 200 (which may be made by quartz) comparing to other types of materials.

Since the photomask 200 may be secured by an electrostatic chuck, electrostatic discharge (ESD) may be induced. Specifically, electrical overstress transient may produce high peak power and/or high electrical field that can destroy circuits having sensitive component. The electrical overstress transient may result from electromagnetic pulse, electrostatic discharge, or lightening, wherein such transient may be increased to a peak magnitude in a short period of time. In order to alleviate the issue stems from electrostatic discharge, the adhesive layer 222w may further include conductive materials. For example, the adhesive layer 222w may be doped with conductive dopant. Specifically, such conductive materials are configured to clamp the transient voltage to a lower value in the duration of electrical overstress transient induction. In response to a greater electrical overstress transient, the adhesive layer 222w may rapidly convert to a lower resistance state; and when the electrical overstress transient is alleviated, the adhesive layer 222w may convert back to a higher resistance state. For example, by utilizing conductive dopant, such as metallic ion (e.g. silver ion), graphene, or the like, may raise the electrical conductivity of the adhesive layer 222w, and may clamp the transient voltage to a lower value. Thereby the risk of inducing electrostatic discharge may be mitigated. Furthermore, the adhesive layer 222w having conductive material may alleviate static electricity accumulation, thereby contribute to ESD prevention.

In some embodiments, the body layer 222x may be optionally included in the protection layer 222, between the adhesive layer 222w and the thermoplastic layer 222y, in order to improve mechanical strength and the reliability of the protection layer 222. In some embodiments, the body layer 222x may improve extensibility of the protection layer 222.

Figure 5:
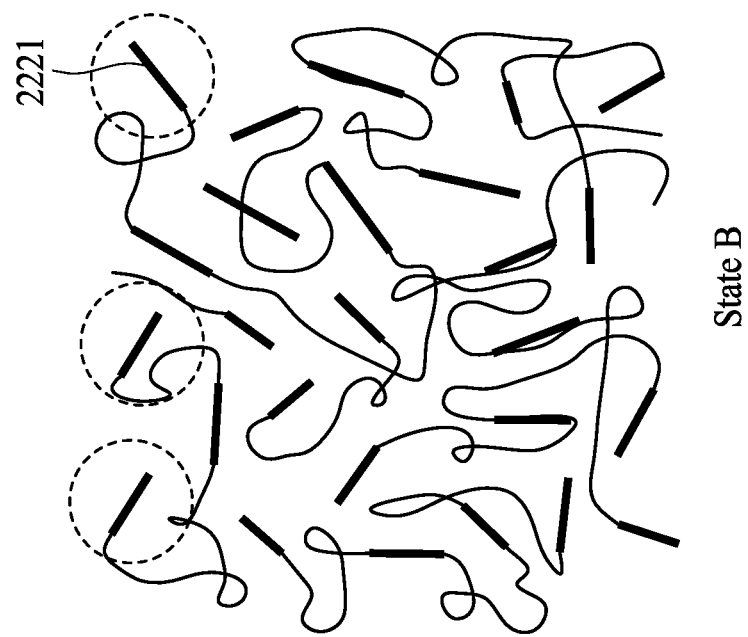
FIG. 5 is a schematic drawing showing two states of a thermoplastic polymer layer of a protection layer, according to some embodiments of the present disclosure.
Figure 5:
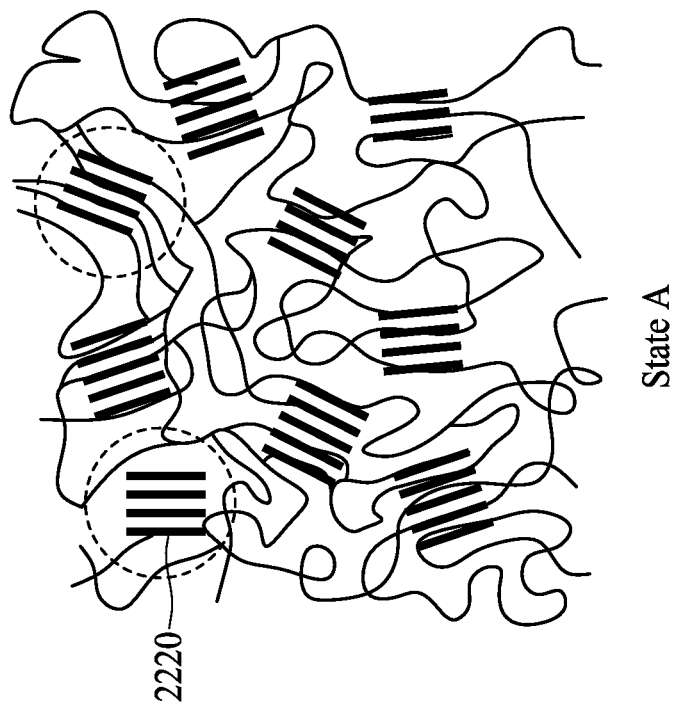

Referring to FIG. 4 and FIG. 5, FIG. 5 is a schematic drawing showing two states of a thermoplastic polymer layer of a protection layer, according to some embodiments of the present disclosure. In some embodiments, the thermoplastic layer 222y includes polymer, such as thermoplastic polyurethanes (TPU), polyvinylidene fluoride (PVDF), the derivatives thereof, the combination thereof, or other suitable materials used as self-healing materials, stimuli responsive material, or shape memory materials. In some embodiments, the polymer of the thermoplastic layer 222y may include cross-linked structure which determines one state of shape, and/or include molecular switches having a state cycle, such as a cycle of crystalline state and non-crystalline state (or amorphous state). In some embodiments, the polymer of the thermoplastic layer 222y may include blocks polymer responsive to temperature changes.

Specifically, as shown in FIG. 5, the polymer of the thermoplastic layer 222y is under state A under a first temperature (such as room temperature or ambient temperature). Under state A, an arrangement of the polymer can be deemed as in crystalline state, which may have crystalline polymer blocks 2220. For example, the polymer may include amide group (—CONH), carbonyl group (—CO), or difluoromethylene group (—CF2). If the protection layer 222 is macroscopically being pressured, squeezed, or scratched microscopically, the number of crystalline polymer blocks 2220 will be increased from a first equilibrium state to a second equilibrium state. If a temperature of the thermoplastic layer 222y is elevated (which may be heated to in a range from about 50 degree Celsius to about 60 degree Celsius by the photomask 200 during lithography operation, as will be subsequently discussed in FIG. 11), the polymer of the thermoplastic layer 222y is converted to state B, and the polymer blocks 2220 of the thermoplastic layer 222y is relaxed out and became multiple relaxed polymers 2221. Under state B, an arrangement of the polymer can be deemed as in non-crystalline state, or in amorphous state. Alternatively stated, a conversion temperature of the polymer of the thermoplastic layer 222y between state A (crystalline state) and state B (non-crystalline state) can be in a range from about 50 degree Celsius to about 60 degree Celsius, or, lower than an operation temperature of a given photomask under a given lithography operation but greater than room temperature or ambient temperature, thereby the polymer of the thermoplastic layer 222y can convert from crystalline state to non-crystalline state during the lithography operation. In some embodiments, when the thermoplastic layer 222y is not heated to be above a certain temperature (such as 50 degree Celsius), the polymer blocks 2220 of the thermoplastic layer 222y may not be effectively relaxed.

If the thermoplastic layer 222y is cooled down from the range of about 50 degree Celsius to about 60 degree Celsius (or an operation temperature of a given photomask) to around room temperature (or ambient temperature), the polymer of the thermoplastic layer 222y is converted from State B (non-crystalline state) to State A (crystalline state). The relaxed polymers 2221 are rearranged to crystalline polymer blocks 2220, thereby the thermoplastic layer 222y may substantially recover to the original state with crystalline polymer blocks 2220 under the aforesaid first equilibrium state, and the scratches created on the protection layer 222 may be substantially, or at least partially, removed.

It should be noted that herein in the present disclosure, the difference of state A (crystalline state) and state B (non-crystalline state) can be defined by respective crystallinities, depending on which material is utilized in the thermoplastic layer 222y.

In some embodiments, polymer that includes amide group, carbonyl group, difluoromethylene group, or the like, may possess similar characteristic of conversion between different crystallinity states by temperature change. As previously discussed, thermoplastic polyurethanes (TPU) and polyvinylidene fluoride (PVDF) are two of the examples. In some embodiments, additive such as plasticizers can be optionally added in the thermoplastic layer 222y.

Referring back to FIG. 4, the hydrophobic layer 222z is over the thermoplastic layer 222y. The hydrophobic layer 222z is a coating layer that has hydrophobic tendency on its exposed surface, and/or has a lower adhesive force with regard to foreign particles. For example, the hydrophobic layer 222z may include polymer, such as polyvinylidene fluoride (PVDF), polyurethane (PU), polypropylene (PP), polyvinyl chloride (PVC), the derivatives thereof, the combination thereof, or the like. Conventional quartz plate includes hydroxyl groups, which have a greater tendency to attract particles on its surface than the hydrophobic layer 222z described herein. In order to facilitate the removal of particles over the photomask 200, incorporating the hydrophobic layer 222z in the protection layer 222 may reduce the attraction force between the particle and the contact surface, while providing a hydrophobic surface that facilitates the deionized water (DI water) cleaning of the particles on the protection layer 222.

Figure 6:
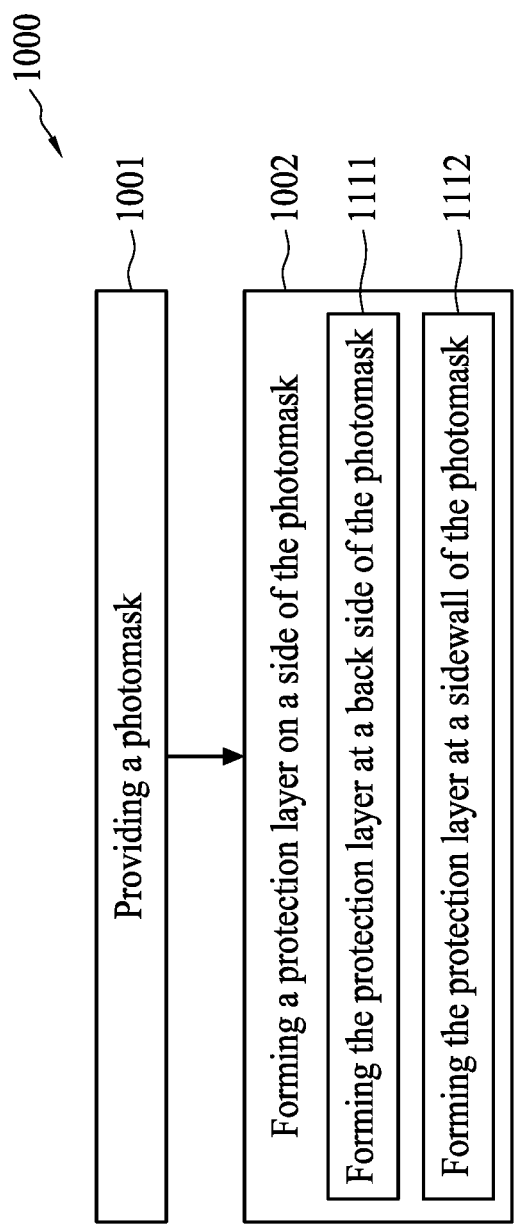
FIG. 6 shows a flow chart representing a method of fabricating a photomask, in accordance with some embodiments of the present disclosure.

Referring to FIG. 6, FIG. 6 shows a flow chart representing a method of fabricating a photomask, in accordance with some embodiments of the present disclosure. The method 1000 for fabricating a photomask includes providing a photomask (operation 1001, which can be referred to FIG. 7), and forming a protection layer on a side of the photomask (operation 1002, which can be referred to FIG. 8A and FIG. 8B). Operation 1002 further includes at least one of the sub-operation forming the protection layer at a back side of the photomask (sub-operation 1111), and forming the protection layer at a sidewall of the photomask (sub-operation 1112).

Figure 7:
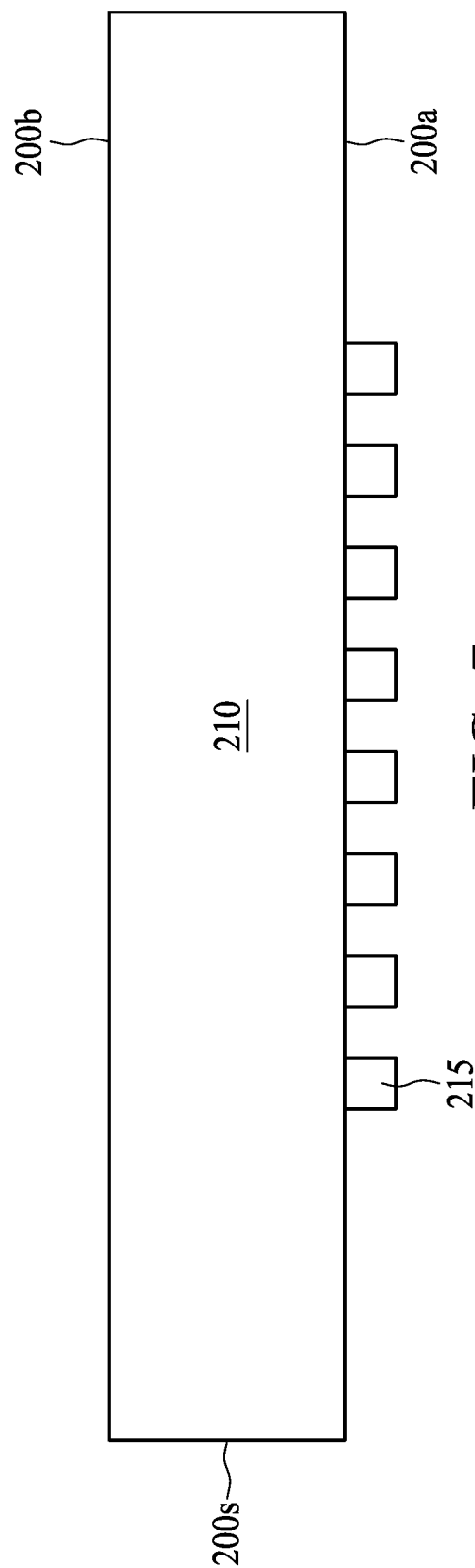
FIG. 7 is a front perspective view of a photomask during intermediate stages of manufacturing operations, according to some embodiments of the present disclosure.

Referring to FIG. 7, FIG. 7 is a front perspective view of a photomask during intermediate stages of manufacturing operations, according to some embodiments of the present disclosure. A photomask 200 is provided, wherein the photomask 200 at least includes a patterned layer 215, a substrate 210, and a protection layer 222. In some embodiments, the photomask 200 is a reflective photomask, such as an extreme ultraviolet (EUV) photomask, or the like. The details of the photomask 200 can be referred to the previous discussion with regard to FIG. 1.

Figure 8A:
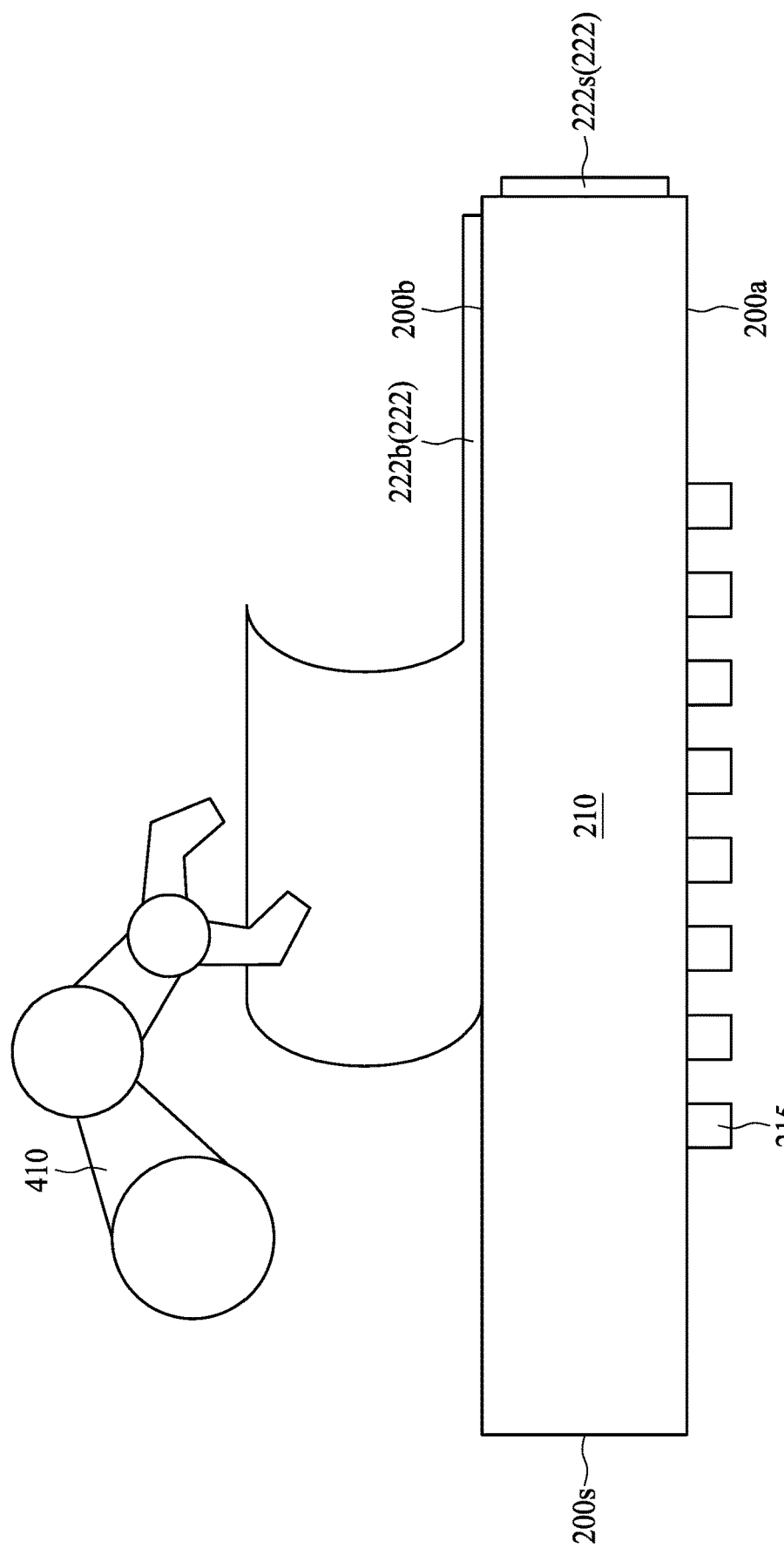
FIG. 8A is a front perspective view of a photomask during intermediate stages of manufacturing operations, according to some embodiments of the present disclosure.
Figure 8B:
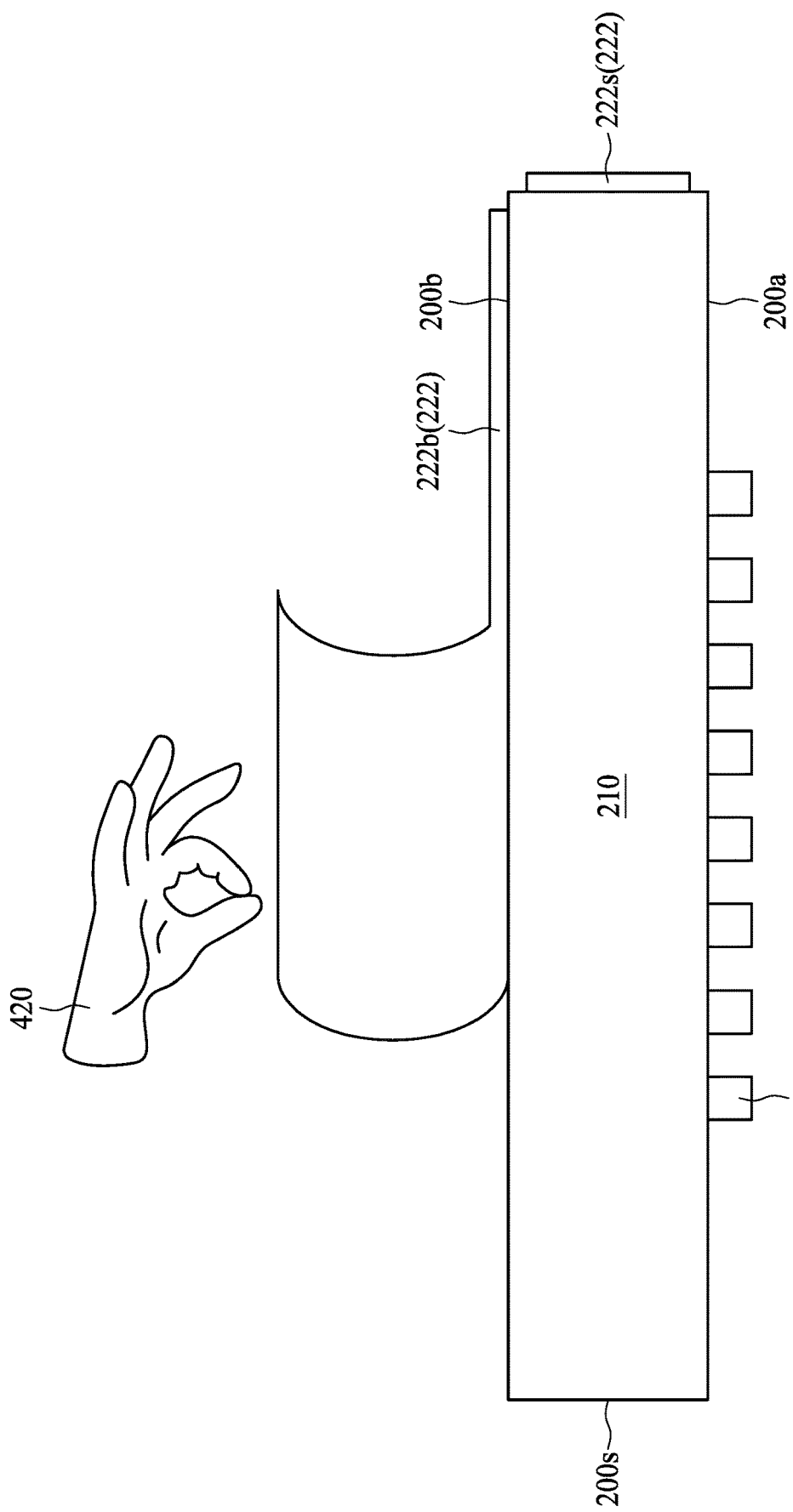
FIG. 8B is a front perspective view of a photomask during intermediate stages of manufacturing operations, according to some embodiments of the present disclosure.

Referring to FIG. 7, FIG. 8A and FIG. 8B, FIG. 8A is a front perspective view of a photomask during intermediate stages of manufacturing operations, FIG. 8B is a front perspective view of a photomask during intermediate stages of manufacturing operations, according to some embodiments of the present disclosure. Subsequently, at least one protection layer 222 is formed on a side of the substrate 210 of the photomask 200, wherein an adhesive side of the protection layer 222 (e.g. adhesive layer 222w) is attached to a side of the photomask 200. The protection layer 222 can be selectively formed on the back side 200b and/or one or more sidewall 200s of the photomask 200. The material of the protection layer 222 on the back side 200b of the photomask 200 (which is denoted as protection layer 222b) and the protection layer 222s on the sidewall 200s of the photomask 200 (which is denoted as protection layer 222s) may, or may not be identical.

As shown in FIG. 8A, in some embodiments, forming the protection layer 222 includes robotic application, for example, which may utilize a robotic arm 410 to attach the protection layer 222 on one or more side of the photomask 200. The robotic application may be semi-automatically or automatically performed. As shown in FIG. 8B, in some alternative embodiments, forming the protection layer 222 includes manual application, for example, which may require a user 420 to attach the protection layer 222 on one or more side of the photomask 200. In some embodiments, the protection layer 222 may optionally be pressed against the photomask 200, thereby the adhesion force between the photomask 200 and the protection layer 222 is increased.

Referring to FIG. 3, FIG. 8A and FIG. 8B, Since the particles on the protection layer 222 may travel from a back side 200b to a sidewall 200s of the photomask 200 as a result of the electric field generated by the e-chuck, the configuration of a gap G (i.e. the discontinuity of the protection layer 222) may hinder the particles from traveling across different sides of the photomask 200 by prohibiting the particles from crossing the gap G, thereby reducing the risk of particles falling on the patterned layer 215 or contaminating substrates or wafers during lithography operations.

In some embodiments, the protection layer 222 is fabricated prior to forming the protection layer 222 on a side of the photomask 200. The operations of fabricating protection layer 222 includes forming an adhesive layer 222w, forming a thermoplastic layer 222y over the adhesive layer 222w, and forming a hydrophobic layer 222z over the thermoplastic layer 222y. The operations of fabricating protection layer 222 may optionally include forming a body layer 222x between the thermoplastic layer 222y and the adhesive layer 222w. Subsequently, the entire protection layer 222 including the adhesive layer 222w, thermoplastic layer 222y, the hydrophobic layer 222z, and/or the body layer 222x is attached to the photomask 200, wherein the adhesive layer 222w contacts with the photomask 200. In some embodiments, the adhesive layer 222w may include polymer with proper cohesive strength, such as acrylic, styrene ethylene styrene (SEBS), polyethylene (PE), pressure-sensitive materials, the derivative thereof, the combination thereof, or the like. The adhesive layer 222w may further be doped with conductive materials, such as metallic ion (e.g. silver ion), graphene, or the like. In some embodiments, the thermoplastic layer 222y includes polymer, such as thermoplastic polyurethanes (TPU), polyvinylidene fluoride (PVDF), the derivatives thereof, the combination thereof, or other suitable materials used as self-healing materials, stimuli responsive material, or shape memory materials. In some embodiments, the hydrophobic layer 222z may include polymer, such as polyvinylidene fluoride (PVDF), polyurethane (PU), polypropylene (PP), polyvinyl chloride (PVC), the derivatives thereof, the combination thereof, or the like. In some embodiments, the body layer 222x includes polymer.

In alternative embodiments, the adhesive layer 222w, the body layer 222x, thermoplastic layer 222y, the hydrophobic layer 222z (or any combination thereof) may be sequentially applied on a side of the photomask 200.

Figure 9:
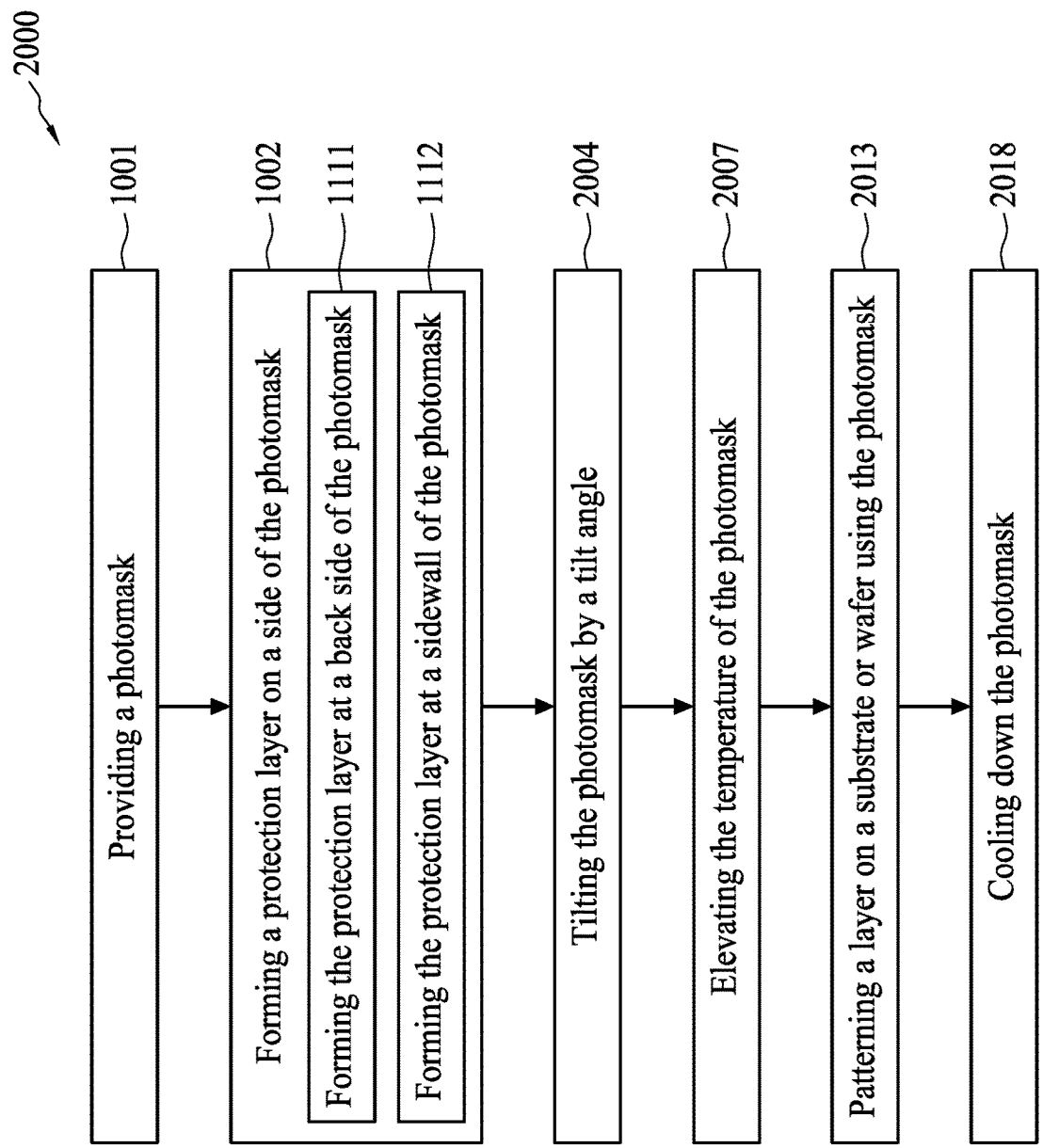
FIG. 9 shows a flow chart representing a method of fabricating an integrated circuit, in accordance with some embodiments of the present disclosure.

Referring to FIG. 9, FIG. 9 shows a flow chart representing a method of fabricating an integrated circuit, in accordance with some embodiments of the present disclosure. The method 2000 for fabricating an integrated circuit includes providing a photomask (operation 1001, which can be referred to FIG. 7), forming a protection layer on a side of the photomask (operation 1002, which can be referred to FIG. 8A and FIG. 8B), tilting the photomask by a tilt angle (operation 2004, which can be referred to FIG. 10), elevating the temperature of the photomask (operation 2007, which can be referred to FIG. 11), patterning a layer on a substrate or wafer using the photomask (operation 2013, which can be referred to FIG. 11), and cooling down the photomask (operation 2018, which can be referred to FIG. 11). Operation 1002 further includes at least one of the sub-operation forming the protection layer at a back side of the photomask (sub-operation 1111), and forming the protection layer at a sidewall of the photomask (sub-operation 1112), as previously discussed in FIG. 6, FIG. 8A, and FIG. 8B.

Figure 10:
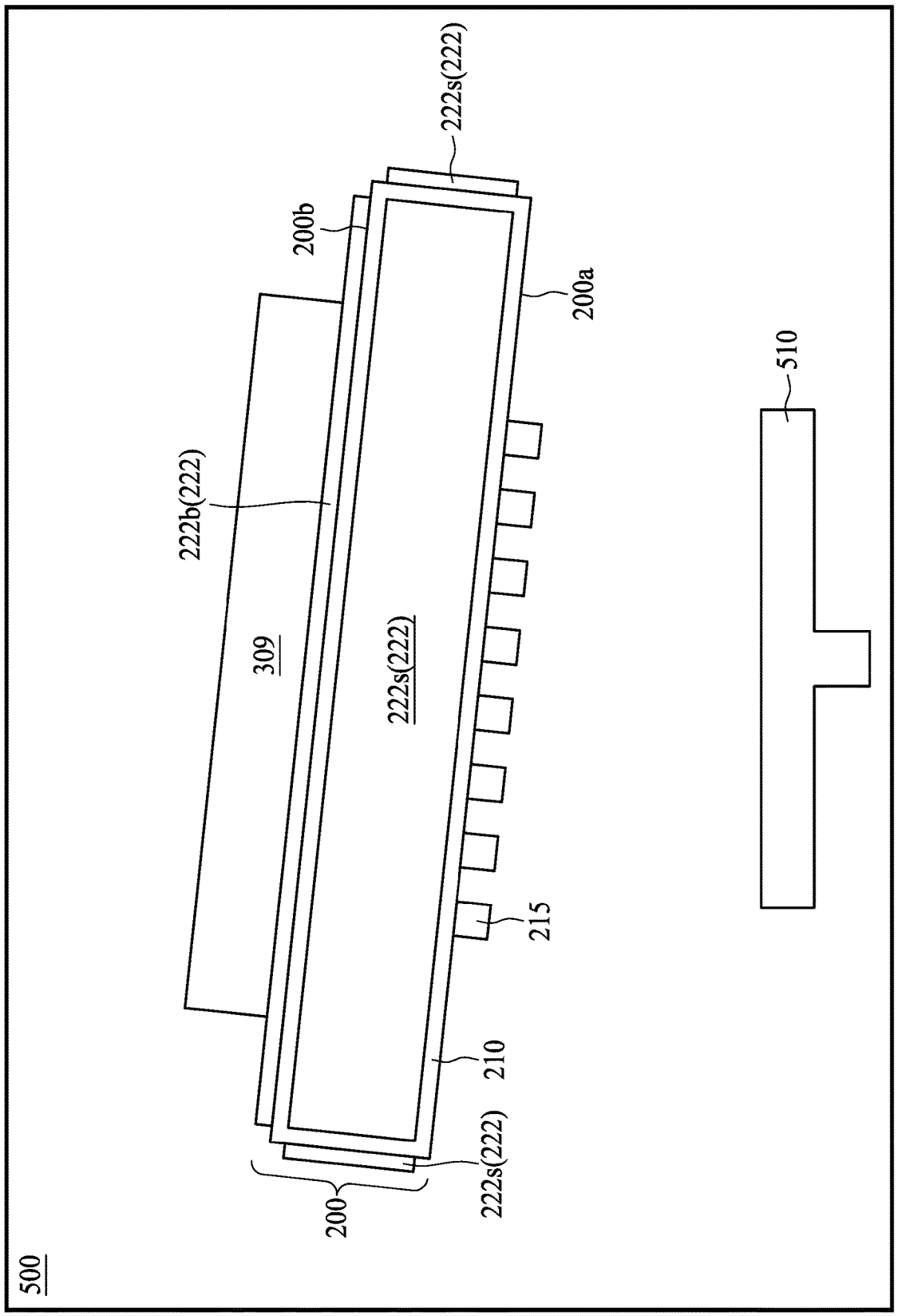
FIG. 10 is a schematic drawing illustrating an apparatus during intermediate stages of lithography operation, according to some embodiments of the present disclosure.

Referring to FIG. 10, FIG. 10 is a schematic drawing illustrating an apparatus during intermediate stages of lithography operation, according to some embodiments of the present disclosure. Subsequent to forming a protection layer 222 on a side of the photomask 200, the photomask 200 is secured by a chuck 309 in an apparatus 500. In some embodiments, the chuck 309 is an electrostatic chuck (E-chuck). Optionally, in some embodiments, a tilt angle of the photomask 200 is adjustable by the chuck 309. The apparatus 500 may further include a supporter 510 to support a wafer or a substrate during a photolithography operation.

Figure 11:
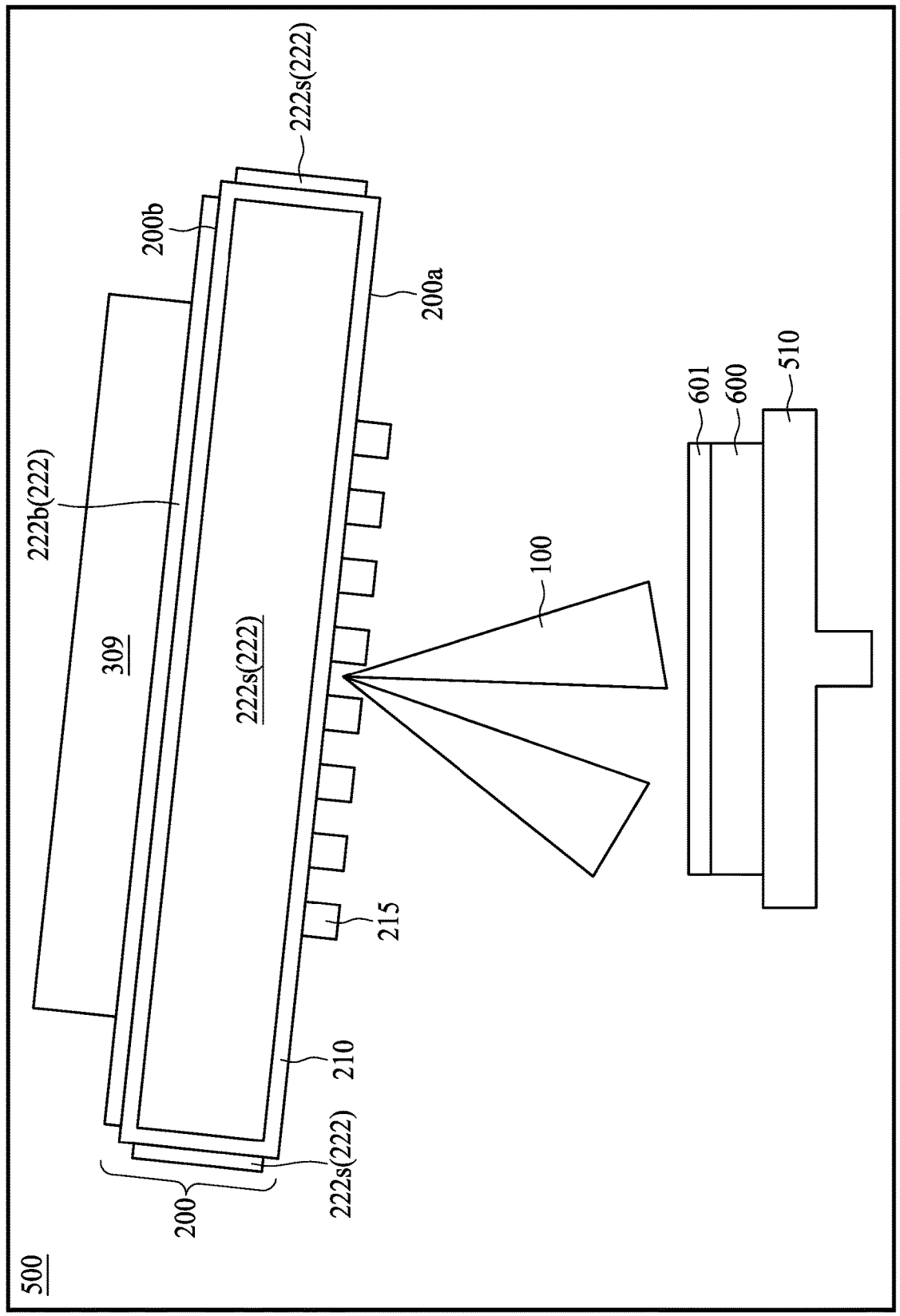
FIG. 11 is a schematic drawing illustrating an apparatus during intermediate stages of lithography operation, according to some embodiments of the present disclosure.

Referring to FIG. 11, FIG. 11 is a schematic drawing illustrating an apparatus during intermediate stages of lithography operation, according to some embodiments of the present disclosure. Subsequently, a layer 601 (e.g. a photoresist layer, a sacrificial layer, a patternable layer, or the like) is formed on a wafer 600, and the wafer 600 is secured by the supporter 510. Thence the layer 601 is patterned by the photomask 200 in a photolithography operation in the apparatus 500. The photolithography operation includes heating the photomask 200, which may include irradiating an actinic radiation 100 on the front side 200a of the photomask 200. In some embodiments, the actinic radiation 100 is extreme ultraviolet (EUV), and the actinic radiation 100 is reflected by the reflective layer 250 (as shown in FIG. 2) of the photomask 200. Since the reflective layer 250 may include metal, a temperature of the photomask 200 as well as the protection layer 222 may be elevated. In some embodiments, the photomask 200 is heated to in a range from about 50 degree Celsius to about 60 degree Celsius. If the photomask 200 is overheated, for example, heated to above 60 degree Celsius, the patterned layer 215 may be unacceptably missized or distorted, thus a temperature of the photomask 200 is controlled to be under 60 degree Celsius, or under a predetermined temperature based on the requirement of the lithography operation or the type of the actinic radiation 100. The layer 601 is thereby patterned. In some embodiments, development operations are subsequently performed in order to fabricate integrated circuit.

It should be noted that, since the protection layer 222 may be expanded under an elevated temperature when performing a lithography operation, the gap G (as shown in FIG. 3) between two protection layers 222 created as a result of forming protection layers 222 on the photomask 200 (as discussed in FIG. 8A and FIG. 8B) may provide an adequate space for expansion and thereby prevent one protection layer 222 to contact an adjacent protection layer 222. A width G of the gap is wide enough so the gap G may not merged under the operable temperature of the photomask 200 under lithography operation. For example, the photomask 200 may be elevated to in a range from about 50 to about 60 degree Celsius during the EUV lithography operation, and the gap G between two protection layers 222 may not close up when the photomask 200 is below 80 degree Celsius. In some embodiments, the apparatus 500 may optionally further include a temperature monitor (not shown in FIG. 11) to detect a temperature of the photomask 200.

As previously discussed in FIG. 4 and FIG. 5, the polymer of the thermoplastic layer 222y converts from state A (crystalline state) to state B (non-crystalline state), wherein a conversion temperature of the polymer of the thermoplastic layer 222y between state A (crystalline state) and state B (non-crystalline state) can be in a range from about 50 degree Celsius to about 60 degree Celsius, or, lower than an operation temperature of a given photomask under a given lithography operation but greater than room temperature or ambient temperature. The polymer blocks 2220 (as well as non-balanced polymer blocks caused by scratch) of the thermoplastic layer 222y is relaxed out and became multiple relaxed polymers 2221 with smaller sizes.

After a certain cycle of lithography operation, the irradiation of the actinic radiation 100 is halted, and the photomask 200 as well as the protection layer 222 is cooled down from the operation temperature (in a range from about 50 degree Celsius to about 60 degree Celsius) to around room temperature (or ambient temperature). Thereby the polymer of the thermoplastic layer 222y is converted from State B (non-crystalline state) to State A (crystalline state). The relaxed polymers 2221 are rearranged to crystalline polymer blocks 2220, and the thermoplastic layer 222y may substantially recover to the original state with crystalline polymer blocks 2220 under the aforesaid first equilibrium state, and the scratches created on the protection layer 222 may be substantially, or at least partially, removed.

Optionally, in some embodiments, after removing the photomask 200 from the apparatus 500, the protection layer 222 of the apparatus 500 can be cleaned. For example, the particles on the protection layer 222 can be cleaned by applying deionized water thereon.

Optionally, in some embodiments, the protection layer 222 can be replaced by another protection layer 222. The removal of the to-be-replaced protection layer 222 from the photomask 200 can either be removed by manual or by robotic. The removal of the protection layer 222 may include pulling the protection layer 222 from an edge. The attachment of another protection layer 222 to the photomask 200 can either be by manual application or by robotic application, as previously discussed in FIG. 8A or FIG. 8B. The robotic application and removal may be semi-automatically or automatically performed.

The present disclosure discloses a photomask 200, a protection layer 222 for a photomask 222, a method for forming a photomask 200, and a method for forming an integrated circuit. The adhesive layer 222w may allow the protection layer 222 to be attached to the photomask 200 with proper adhesive strength, and alleviate issue of glue residue remaining on the photomask 200 when removing the protection layer 222. Furthermore, since the adhesive layer 222w may be doped by conductive materials, the issue of electrostatic discharge caused by the chuck 309 may be alleviated. The hydrophobic layer 222z of the protection layer 222 facilitate the removal of particles thereon, and the thermoplastic layer 222y of the protection layer 222 recovers scratches by switching between crystalline state and non-crystalline state stimulated by changing temperature. By incorporating the protection layer 222 having the thermoplastic layer 222y to a photomask 200 that a temperature thereof may be elevated during a photolithography operation, the scratches may be at least partially recovered during such photolithography operation, thus the reliability of the photomask 200 and the efficiency of recovering scratches are improved.

In addition, by having a gap G between adjacent protection layers 222, the moving particles may be stuck in the gap G or at an edge of the protection layer 222, and the contamination on wafers 600 caused by such particles may be alleviated. And the gap G is configured to provide a space for the adjacent protection layer 222 to expand without contacting each other.

By removing particles falls on the photomask 200 or recovering scratches on the photomask 200, an electrostatic force between the photomask 200 and the chuck 309 may be improved, thus alleviate the risk of photomask 200 undesirably detached from the chuck 309. In addition, the accuracy of adjusting a tilt angle of the photomask 222 can thereby be improved.

Some embodiments of the present disclosure provide a photomask, including a front side having a patterned layer, a back side opposite to the front side, a sidewall connecting the front side and the back side, a reflective layer between the front side and the back side, and a polymer layer on the backside of the photomask.

Some embodiments of the present disclosure provide a protection layer for extreme ultra-violet (EUV) photomask, including an adhesive layer, a thermoplastic layer over the adhesive layer, a hydrophobic layer over the thermoplastic layer, wherein the thermoplastic layer comprises polymer having a crystalline-non crystalline conversion temperature in a range of from about 50 to 60 degrees Celsius.

Some embodiments of the present disclosure provide a method for fabricating a photomask, including providing a photomask, comprising a substrate, a reflective layer, and a patterned layer, forming a protection layer at a substrate side of the photomask, wherein the protection layer comprising an adhesive layer attaching to a substrate side of the photomask.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A photomask, comprising:
   a substrate, comprising:
      a front side having a patterned mask layer;
      a back side opposite to the front side;
      a sidewall connecting the front side and the back side;
   an extreme ultra-violet(EUV) reflective layer formed in a recess of the substrate; and
   a polymer layer on the backside of the photomask, wherein the polymer layer comprises a thermoplastic polymer and a hydrophobic layer, wherein the thermoplastic polymer is between the hydrophobic layer and the back side of the photomask.

2. The photomask of claim 1, wherein the polymer layer is further disposed at the sidewall of the photomask.

3. The photomask of claim 2, wherein the polymer layer on the backside is physically separated from the polymer layer at the sidewall.

4. The photomask of claim 1, wherein the thermoplastic polymer layer comprises thermoplastic polyurethanes (TPU) or polyvinylidene fluoride (PVDF).

5. The photomask of claim 1, wherein the thermoplastic polymer comprises a crystalline-non crystalline conversion temperature in a range of from about 50 to 60 degrees Celsius.

6. The photomask of claim 1, wherein the polymer layer further comprises an adhesive layer between the thermoplastic polymer and the back side of photomask.

7. The photomask of claim 6, wherein the adhesive layer comprises electrically conductive materials.

8. The photomask of claim 1, wherein at least a portion of the backside of the photomask is exposed from the polymer layer.

9. A protection layer for extreme ultra-violet (EUV) photomask, comprising:
an adhesive layer, wherein the adhesive layer comprises a conductive dopant consisting of a metallic ion or a graphene;
a thermoplastic layer over the adhesive layer;
a hydrophobic layer over the thermoplastic layer,
wherein the thermoplastic layer comprises polymer layer having a crystalline-non crystalline conversion temperature in a range of from about 50 to 60 degrees Celsius.

10. The protection layer of claim 9, wherein the polymer layer comprises thermoplastic polyurethanes (TPU) or polyvinylidene fluoride (PVDF).

11. The protection layer of claim 9, wherein the hydrophobic layer comprises polyvinylidene fluoride (PVDF), polyurethane (PU), polypropylene (PP), or polyvinyl chloride (PVC).

12. The protection layer of claim 9, wherein the adhesive layer comprises acrylic, styrene ethylene butylene styrene (SEBS), or polyethylene.

13. The protection layer of claim 9, wherein the metallic ion is silver ion.

14. A method for fabricating a photomask, comprising:
providing a photomask, comprising a substrate having a first surface and a second surface opposite to the first surface, an extreme ultra-violet(EUV) reflective layer, and a patterned mask layer over the first surface of the substrate;
forming a first protection layer over a first sidewall of the substrate, wherein the first sidewall connects between the first surface and the second surface, wherein the first protection layer comprises an adhesive layer facing the first sidewall; and
forming a second protection layer over a second sidewall of the substrate, wherein the second sidewall connects between the first surface and the second surface, wherein a corner of the substrate between the first sidewall and the second sidewall is exposed from the first protection layer and the second protection layer.

15. The method of claim 14, wherein forming the first protection layer comprises manual application or robotic application.

16. The method of claim 14, wherein forming the first protection layer further comprises forming a thermoplastic polymer layer over the adhesive layer.

17. The method of claim 16, wherein forming the first protection layer further comprises forming a hydrophobic layer over the thermoplastic polymer layer.

18. The method of claim 14, further comprising forming a third protection layer over the second surface of the substrate, the third protection layer is apart from the first protection layer.

19. The method of claim 14, further comprising elevating a temperature of the photomask to be in a range between 50 degree Celsius to 60 degree Celsius, wherein the corner of the substrate between the first sidewall and the second sidewall is exposed from the first protection layer and the second protection layer after elevating the temperature of the photomask.

20. The method of claim 14, further comprising adding dopant of metallic ion or graphene into the first protection layer.

* * * * *